United States Patent
Lee et al.

(10) Patent No.: US 10,304,196 B2
(45) Date of Patent: May 28, 2019

(54) FILE CONVERSION METHOD AND APPARATUS

(71) Applicants: Ju Sung Lee, Seoul (KR); Jong Sun Hong, Seoul (KR)

(72) Inventors: Ju Sung Lee, Seoul (KR); Jong Sun Hong, Seoul (KR)

(*) Notice: Subject to any disclaimer, the term of this patent is extended or adjusted under 35 U.S.C. 154(b) by 0 days.

(21) Appl. No.: 15/542,628

(22) PCT Filed: Jan. 8, 2016

(86) PCT No.: PCT/KR2016/000170
§ 371 (c)(1),
(2) Date: Jul. 10, 2017

(87) PCT Pub. No.: WO2016/111573
PCT Pub. Date: Jul. 14, 2016

(65) Prior Publication Data
US 2018/0268551 A1    Sep. 20, 2018

(30) Foreign Application Priority Data
Jan. 8, 2015 (KR) .......... 10-2015-0002985

(51) Int. Cl.
*G06T 7/13* (2017.01)
*G06F 17/50* (2006.01)
(Continued)

(52) U.S. Cl.
CPC ............... *G06T 7/13* (2017.01); *G06F 17/50* (2013.01); *G06T 5/20* (2013.01); *G06T 7/00* (2013.01);
(Continued)

(58) Field of Classification Search
CPC ......... G06T 7/13; G06T 5/20; G06T 2200/08; G06T 2211/432; G06F 17/50
See application file for complete search history.

(56) References Cited

U.S. PATENT DOCUMENTS

| | | | |
|---|---|---|---|
| 6,647,147 B1* | 11/2003 | Miyano | G03F 7/705 382/190 |
| 2013/0170756 A1* | 7/2013 | Shibasaki | G06K 9/4604 382/199 |

(Continued)

FOREIGN PATENT DOCUMENTS

| | | |
|---|---|---|
| JP | 10-162034 A | 6/1998 |
| JP | 10-162041 A | 6/1998 |

(Continued)

OTHER PUBLICATIONS

Machine translation for JP2014-071501 (Year: 2014).*
(Continued)

*Primary Examiner* — Qian Yang
(74) *Attorney, Agent, or Firm* — Novick, Kim & Lee, PLLC; Sang Ho Lee

(57) ABSTRACT

The present invention relates to a method for converting an image file or document file into a drawing file including the steps of extracting an outline from an image of a subject file to be drafted; detecting corner feature points from the image of the subject file to be drafted based on the extracted outline to coordinate the corner feature points into outer edge coordinate information and connecting the detected corner feature points with a line to generate a first image; removing the outline from the image of the subject file to be drafted and detecting one or more elements to coordinate the elements into element coordinate information and generating a second image including the one or more detected elements; template matching by superimposing the generated first image and second image; and generating a drawing file for the subject file to be drafted by using the outer edge coordinate information and element coordinate information.

12 Claims, 10 Drawing Sheets

(51) Int. Cl.
 *G06T 5/20* (2006.01)
 *G06T 7/00* (2017.01)
(52) U.S. Cl.
 CPC ..... *G06T 2200/08* (2013.01); *G06T 2211/432* (2013.01)

(56) References Cited

U.S. PATENT DOCUMENTS

2015/0055085 A1* 2/2015 Fonte ................ G06Q 30/0621
 351/178
2015/0331643 A1* 11/2015 Nishikawa ............ G06F 3/1215
 358/1.13
2016/0093058 A1* 3/2016 Moteki .................... G06T 7/73
 382/154

FOREIGN PATENT DOCUMENTS

| JP | 2001-101430 A | | 4/2001 |
| JP | 2001-282870 A | | 10/2001 |
| JP | 2014-071501 | * | 4/2014 |
| JP | 2014-126893 | * | 7/2014 |

OTHER PUBLICATIONS

Machine translation for JP2014-126893 (Year: 2014).*
Lee, Sang Heon et al., "A Study on Analysis of the Template Component for the Development of BIM Template". Journal of Korea Institute Ecological Architecture and Environment, vol. 11, No. 2, pp. 123-130 (Apr. 2011).

* cited by examiner

FILE CONVERSION METHOD AND APPARATUS

BACKGROUND OF THE INVENTION

1. Field of the Invention

The present invention to a method and apparatus for converting an image or document file into a drawing file.

2. Description of the Related Art

Generally, when designing a drawing, a CAD program is installed in a personal computer or a notebook computer or the like, a figure is drawn using a device such as a mouse or a tablet, and the result is calculated.

The calculated design drawing (DWG, DXF) can be opened by another computer using a CAD program, and a new design drawing can be calculated through editing such as modification.

In addition, if the calculated design drawing is converted into an image file (JPG file, GIF file, PNG file, etc.) or a PDF file, the image file can be viewed using another view program, but it is impossible to use the image file again.

That is, when a design drawing is converted into an image file, it is impossible to reuse the design drawing.

On the other hand, the conventional technology for converting a file such as an image file back to a CAD drawing is an electronic pen combined with a mouse that interlocks with CAD, or a system that generates, stores, and records CAD files automatically anytime and anywhere desirable to the user without being limited by time and space on the web, wherein a pen-shaped optical mouse capable of simultaneous CAD control and handwriting input is used, and a user can create an image and drawing file (DWG, DXF) just with a sketch, which is recorded in a storage device (memory) inside the pen. In addition, just by the user inputting handwriting, it can be created into a file of TEXT type and it is also possible to make it into a drawing in a TEXT (character) form of CAD to store.

However, the above-described conventional technology has a disadvantage in that it is impossible to reuse an image file because the image file cannot be converted into a design drawing. Further, the conventional technology for automatically generating a CAD drawing using a digital electronic pen mouse is inconvenient in that a user must do the sketching him/herself or manually read the design drawing with a digital electronic pen mouse.

SUMMARY OF THE INVENTION

It is an object of the present invention to provide a file conversion method and apparatus that makes an image file or a document file into a drawing to allow use thereof.

According to an aspect of the present invention, there is provided a file conversion method including converting an image file or a document file into a drawing file and extracting an outline from an image of a subject file to be drafted; detecting corner feature points from the image of the subject file to be drafted based on the extracted outline to coordinate the corner feature points into outer edge coordinate information and connecting the detected corner feature points with a line to generate a first image; removing the outline from the image of the subject file to be drafted and detecting one or more elements to coordinate the elements into element coordinate information and generating a second image including the one or more detected elements; template matching by superimposing the generated first image and second image; and generating a drawing file for the subject file to be drafted by using the outer edge coordinate information and element coordinate information.

A file conversion apparatus according to an embodiment of the present invention includes an input unit for receiving a subject file to be drafted; an image processing unit for extracting an outline from an image of the subject file to be drafted, detecting corner feature points from the image of the subject file to be drafted based on the extracted outline to coordinate the corner feature points into outer edge coordinate information and connecting the detected corner feature points with a line to generate a first image, removing the outline from the image of the subject file to be drafted and detecting one or more elements to coordinate the elements into element coordinate information and generating a second image including the one or more detected elements, template matching by superimposing the generated first image and second image, and then generating a drawing file for the subject file to be drafted by using the outer edge coordinate information and element coordinate information; and a storage unit for storing the generated drawing file.

Meanwhile, the file conversion method may be embodied as a computer-readable recording medium on which a program for execution by a computer is recorded.

In addition, a program for executing the file conversion method on a computer may be installed in a terminal device according to an embodiment of the present invention.

According to an embodiment of the present invention, various image files and document files can be converted into drawing files without manual operation of the user, so image or document files can be easily drawn and reused by an automatic program.

According to another embodiment of the present invention, by implementing an indoor 3D drawing and object information as an augmented reality based on actual measurement information, it is possible to implement augmented reality more realistically and to designate an object generation position of the augmented reality, thereby allowing the object to be easily placed without actual 3D drawing information.

DETAILED DESCRIPTION OF THE INVENTION

Hereinafter, embodiments of the present invention will be described in detail with reference to the accompanying drawings.

The various embodiments described below may be implemented in a recording medium readable by a computer or similar device using software, hardware, or a combination thereof.

In accordance with a hardware implementation, embodiments of the present invention may be implemented using at least one of, application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, and electrical units for performing functions.

On the other hand, according to a software implementation, embodiments such as procedures or functions may be implemented with separate software modules that perform at least one function or operation. Software codes may be implemented by a software application written in an appropriate programming language.

Further, the software codes may be stored in a memory of various terminal devices such as a mobile phone, a smart phone, a laptop computer, a desktop personal computer (PC), and the like.

Figure 1:
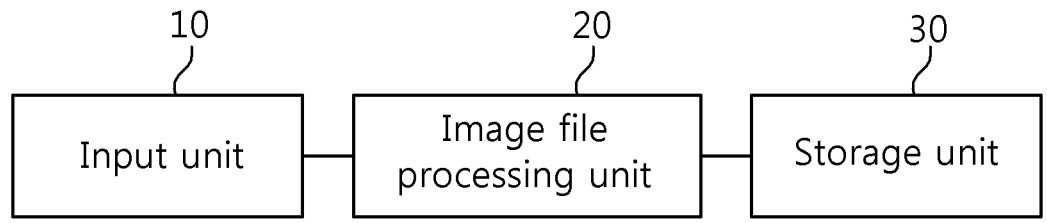
FIG. 1 is a block diagram showing a schematic configuration of a file conversion apparatus according to an embodiment of the present invention.

FIG. 1 is a block diagram illustrating a configuration of a file conversion apparatus according to an embodiment of the present invention. The illustrated file conversion apparatus includes an input unit 10, an image file processing unit 20, and a storage unit 30.

Referring to FIG. 1, the input unit 10 is a part for inputting a file to be drafted, that may be implemented as a USB port for receiving a file being input through an external device or a communication module for inputting or downloading a file through a network. Here, the file for drafting may include at least one of an image file (JPG file, GIF file, PNG file, etc.) and a PDF file. The PDF file may refer to a file imaged through its own algorithm.

Meanwhile, the image file processing unit 20 plays the role of drafting the file input through the input unit 10 and saving the file in the storage unit 30.

Figure 2:
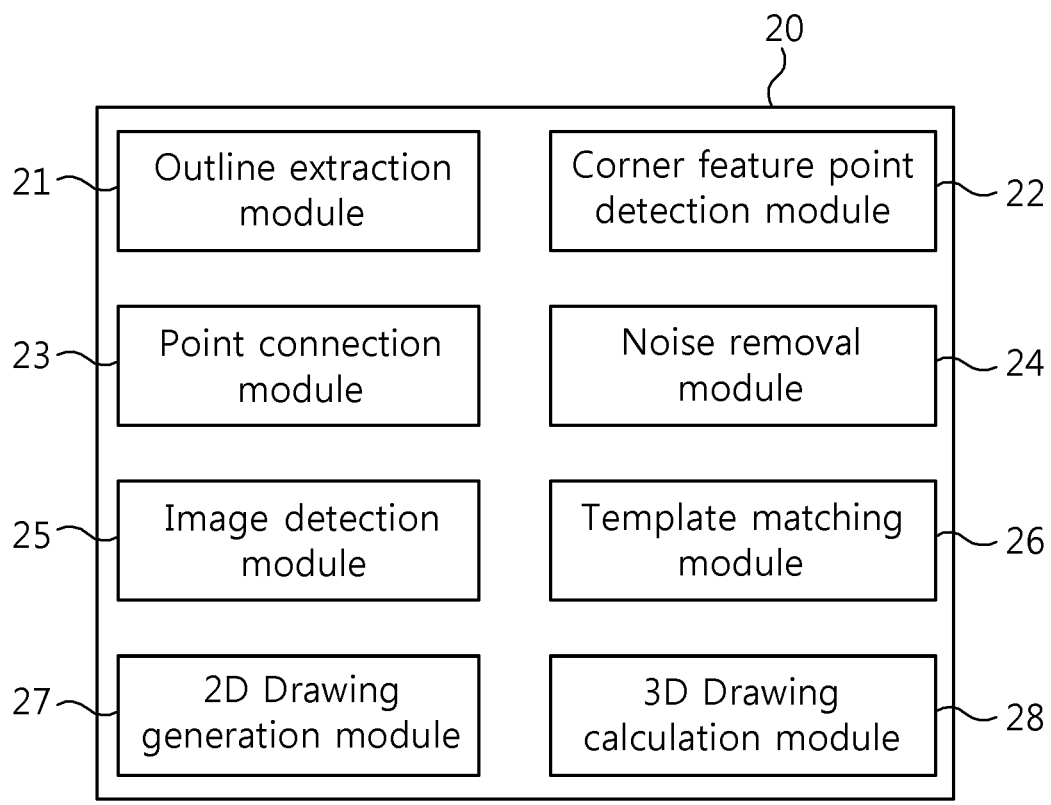
FIG. 2 is a block diagram showing an embodiment of the configuration of the image file processing unit shown in FIG. 1.

As shown in FIG. 2, the image file processing unit 20 includes an outline extraction module 21 for extracting an outline from an input file, a corner feature point detection module 22 for detecting a corner feature point based on the extracted outline, a point connection module 23 for connecting the detected corner feature points with a line, a noise removal module 24 for removing noise from the connected lines, an image detection module 25 for detecting an image from which an outer edge is removed, a template matching module 26 for template matching the noise-removed image and the outer edge-removed image, a 2D drawing generation module 27 for generating a 2D drawing for an input file by applying stored outer edge coordinate information and element coordinate information to a CAD program, and a 3D drawing calculation module 28 for calculating a 3D drawing based on the generated 2D drawing.

A file conversion method according to an embodiment of the present invention extracts an outline from an image of a subject file to be drafted, detects corner feature points from the image of the subject file to be drafted based on the extracted outline to coordinate the corner feature points into outer edge coordinate information and connects the detected corner feature points with a line to generate a first image.

Further, the method removes the outline from the image of the subject file to be drafted and detects one or more elements to coordinate the elements into element coordinate information and generate a second image including the one or more detected elements.

In addition, the method performs template matching by superimposing the generated first image and second image and then generates a drawing file for the subject file to be drafted by using the outer edge coordinate information and element coordinate information.

For example, the subject file to be drafted may include at least one of a JPG file, a GIF file, a PNG file, and a PDF file.

Meanwhile, the outline extracting step may convert the image of the file to be drafted into gray scale, truncate codes the image converted into gray scale to obtain the most significant bit information, and applies a median filter to the most significant bit information for smoothing out, to allow the outline to be extracted. Here, the most significant bit information obtaining step may use bit-plane slicing.

The first image generating step may detect a corner image from the outline-extracted image by using Harris corner detection and may detect the corner feature points using the detected corner image. The first image may be noise-removed.

The second image generating step may detect an outline by obtaining information on a linear component significant in the noise-removed first image, and may detect an element including at least one of a door, a window and a washbasin from which the detected outline is removed.

Further, the template matching step may template-match the first and second images with priority on at least one of a door, a window, and a washbasin.

Meanwhile, the element coordinate information detects a position value of the detected element, and may be obtained by calculating a position value of the outline-removed image and detected element.

The drawing file generation step generates a 2D drawing by applying the outer edge coordinate information and the element coordinate information to a CAD program, and a 3D drawing file may be generated based on the generated drawing file.

Figure 3:
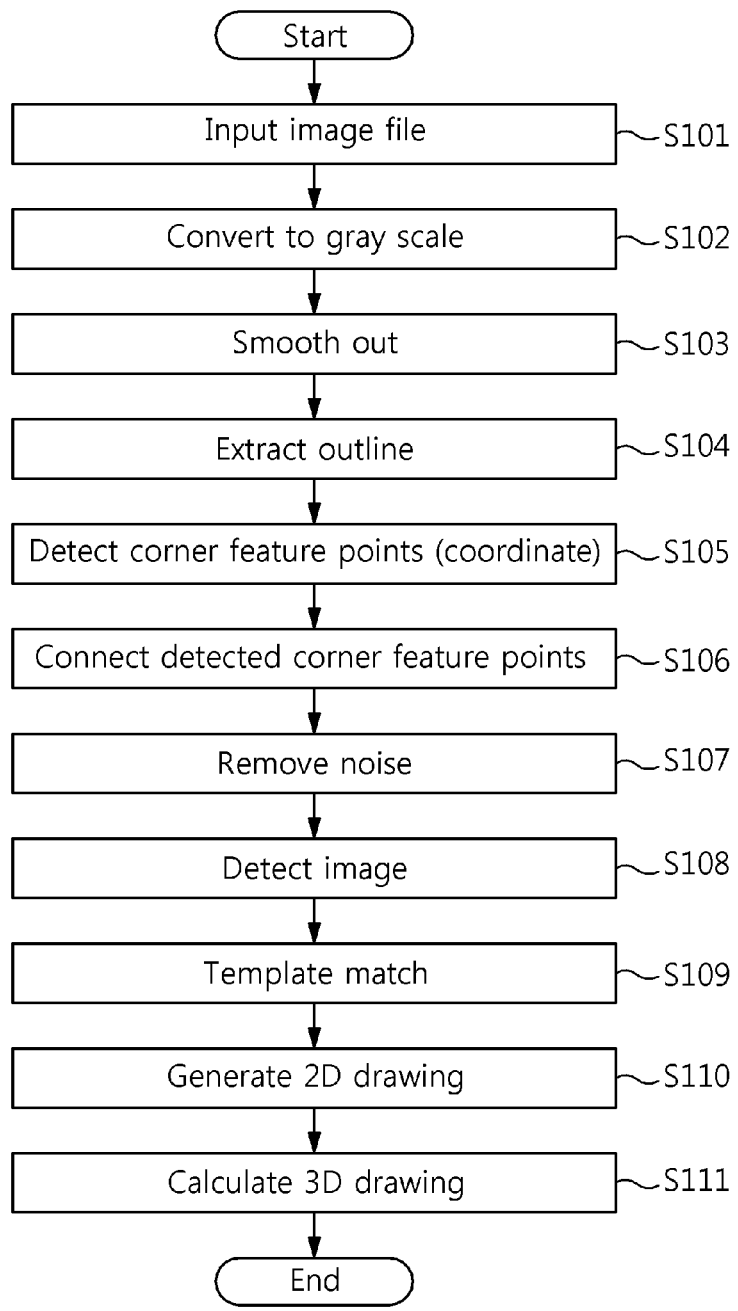
FIG. 3 is a flowchart illustrating a file conversion method according to an embodiment of the present invention.

FIG. 3 is a flowchart illustrating a file conversion method according to an exemplary embodiment of the present invention, wherein a method of drafting an image file such as a JPG file, a GIF file, or a PNG file, or a document file such as a PDF file into a file that can be used such as a CAD file.

Referring to FIG. 3, a file conversion method according to an embodiment of the present invention includes: (a) receiving a subject file to be drafted in step S101; (b) extracting an outline from the input file in steps S102 to S104; (c) detecting corner feature points based on the extracted outline to make into coordinates in step S105; (d) connecting the detected corner feature points with a line in step S106; (e) removing noise from the lines connected in the step (d), in step S107; (f) detecting an image from which an outline has been removed from the input file in step S108; (g) template matching the noise-removed image in step (e) and the image detected in step (f), in step S109; (h) after the template matching in step (g), generating a 2D drawing for the input file by applying the stored outer edge coordinate information and element coordinate information to the CAD program in step S110; (i) calculating a 3D drawing based on the 2D drawing generated in step (h), in step S111.

Meanwhile, step (b) may include the steps of: (b1) converting the input image file information into gray scale in step S102; (b2) truncation coding by bit-plane slicing the information converted into gray scale, storing the most significant bit information image among the truncation coded information, using a median filter to smooth out the truncation coded information to extract the outline and storing the resultant image in steps S103 to S104.

In step (f), information about a linear component which is significant in the noise-removed image is stored, the converted gray scale image and median filter may be used for smoothing out and an outline-extracted image may be calculated to allow the detection of an image from which an outer edge has been removed.

In step (h), the position value of the element matched in the template matching is stored, the element coordinate information is extracted by calculating the image finished with detecting the outer edge and the position value of the stored element, and the outer edge coordinate information and the element coordinate information are applied to a CAD program and an input file (image file, PDF file) can be 2D drafted.

Hereinafter, a file conversion method according to an embodiment of the present invention will be described in detail.

Figure 4:
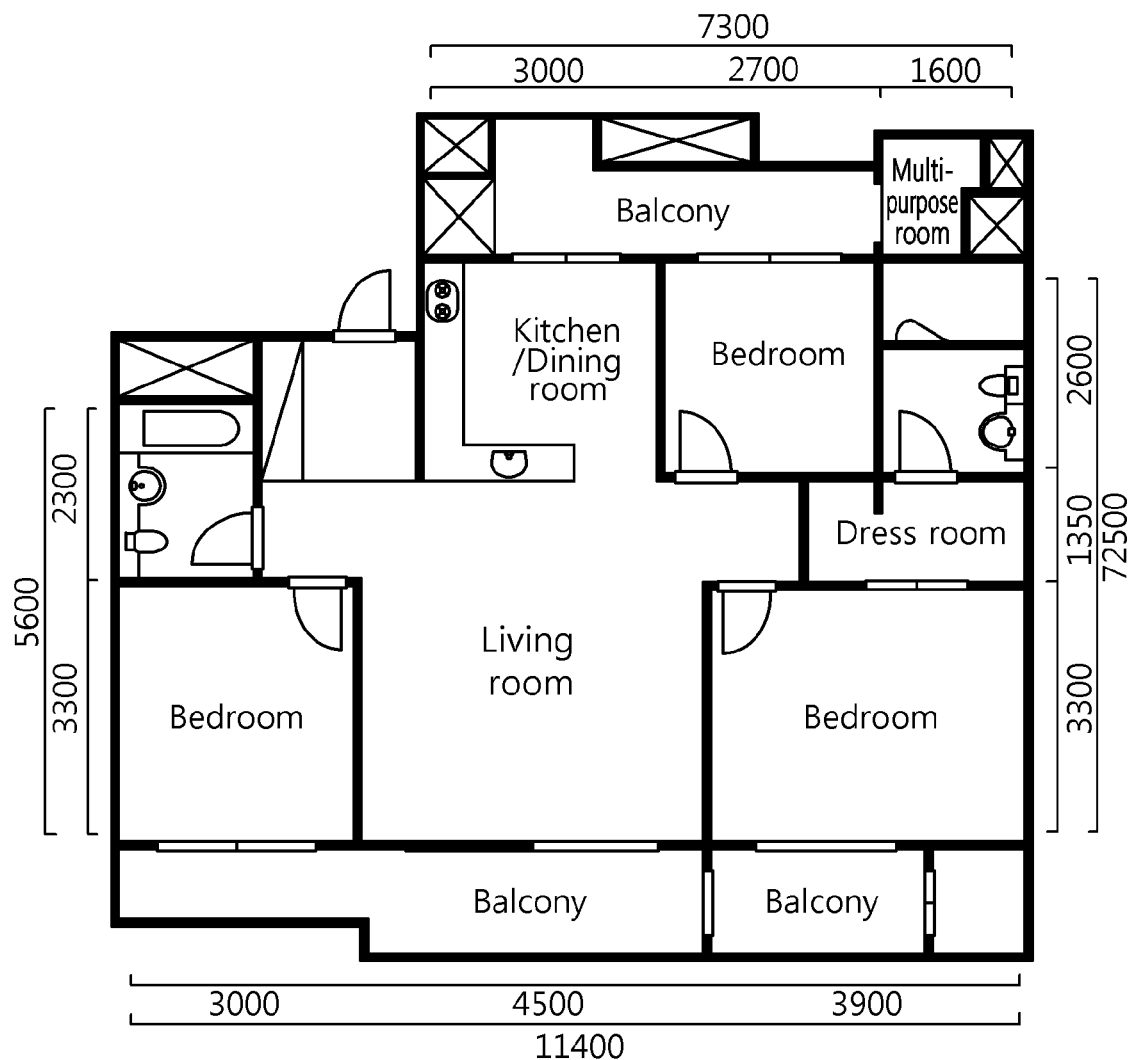
FIGS. 4 to 7 are views for explaining an embodiment of a method of drafting an image file.

First, a subject file to be drafted is inputted through the input unit 10 in step S101. Here, the file to be drafted includes at least one of an image file (JPG file, GIF file, PNG file, etc.) and a PDF file. FIG. 4 is an exemplary diagram showing a case where an input file is an image file.

When the image file is inputted, the image file processing unit 20 processes the inputted image file and drafts it.

For example, the input image file information is converted into gray scale (image 1) in step S102. A digital image refers to an image in which the value of each pixel is one sample, and can only transmit information of luminosity. Such kind of image, also known as black and white, consists of gray shadows, ranging from "black" of the lightest luminous intensity to "white" of the strongest luminous intensity. Therefore, the brightness of each pixel can be determined by converting image file information to gray scale.

Next, the image information converted into gray scale is truncation-coded by a bit-plane slicing method. That is, loss compression is performed.

For example, one pixel of an 8-bit gray image is composed of 8 bits, and the most significant hit among the 8 bits is called MSB and the least significant bit is called LSB. The lower 4 bits are truncated to perform loss compression.

Thereafter, the most significant hit information image (image 2) of the truncation-coded information is stored in the storage unit 30, the truncation-coded information is smoothed using a median filter to extract an outline, and the resultant image (image 3) is stored.

Here, the smoothing using the median filter means that the intensity of each pixel is replaced with the intermediate value of the intensity of light in the surrounding points of the pixel instead of an average value. This smoothing method is particularly effective when the noise form is strong and consists of elements such as elongated lines, and corner sharpening is well preserved through such a smoothing method.

Figure 5:
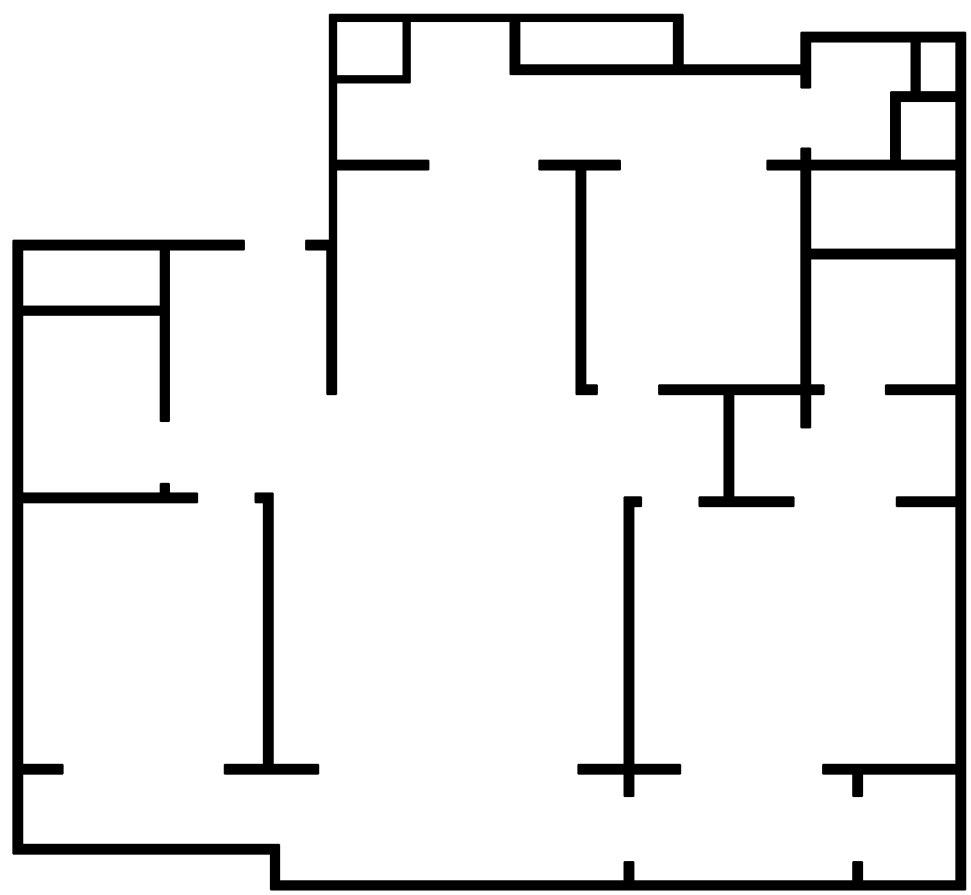

FIG. 4 shows an example of an image file to be converted into a drawing file by the file conversion method according to the present invention, and FIG. 5 shows an example of a result of extracting an outline from the image file shown in FIG. 4.

Next, in step S105, corner feature points are detected based on the extracted outline and are converted into coordinates.

Figure 6:

FIG. 6 shows an example of the result of extracting corner feature points from the image file.

For example, with the information of the outline-extracted image, a corner image (image 4) is detected through Harris corner detection, and the outline-detected image (image 3) and corner image (image 4) are calculated to allow detection of the corner feature points.

Here, the Harris corner detection is an algorithm that recognizes points as corner points (corner) where change is occurred in all directions, not when there is no change in all directions or when changes occur only in a constant direction following an edge, when an arbitrary region (window) is generated in the image and searched.

Next, in step S106, the detected corner feature points are connected with a line (image 5). Thereafter, noise is removed from the connected lines in step S107.

For example, an image from which the outline is detected (image 3) and an image where the corner feature points are connected by lines (image 5) may be calculated (logical AND) and the noise on the lines may be removed.

Next, in step S108, an image where the outer edge has been removed from the image file is detected.

For example, it is possible to store information about significant linear components in a noise-free image, and to detect elements in an image where outer edge detecting is finished (image 6).

Here, the element may mean an image, not an outline in the image file as shown in FIG. 4. For example, a door, a window, a washbasin, and the like can be elements.

Then, the converted gray scale image (image 1) and the median filter are used for smoothing, and the outline-extracted image (image 3) is calculated and an image from which an outer edge is removed may be detected.

Thereafter, in step S109, the image from which noise is removed and the image from which an element is detected are subjected to template matching.

Figure 7:
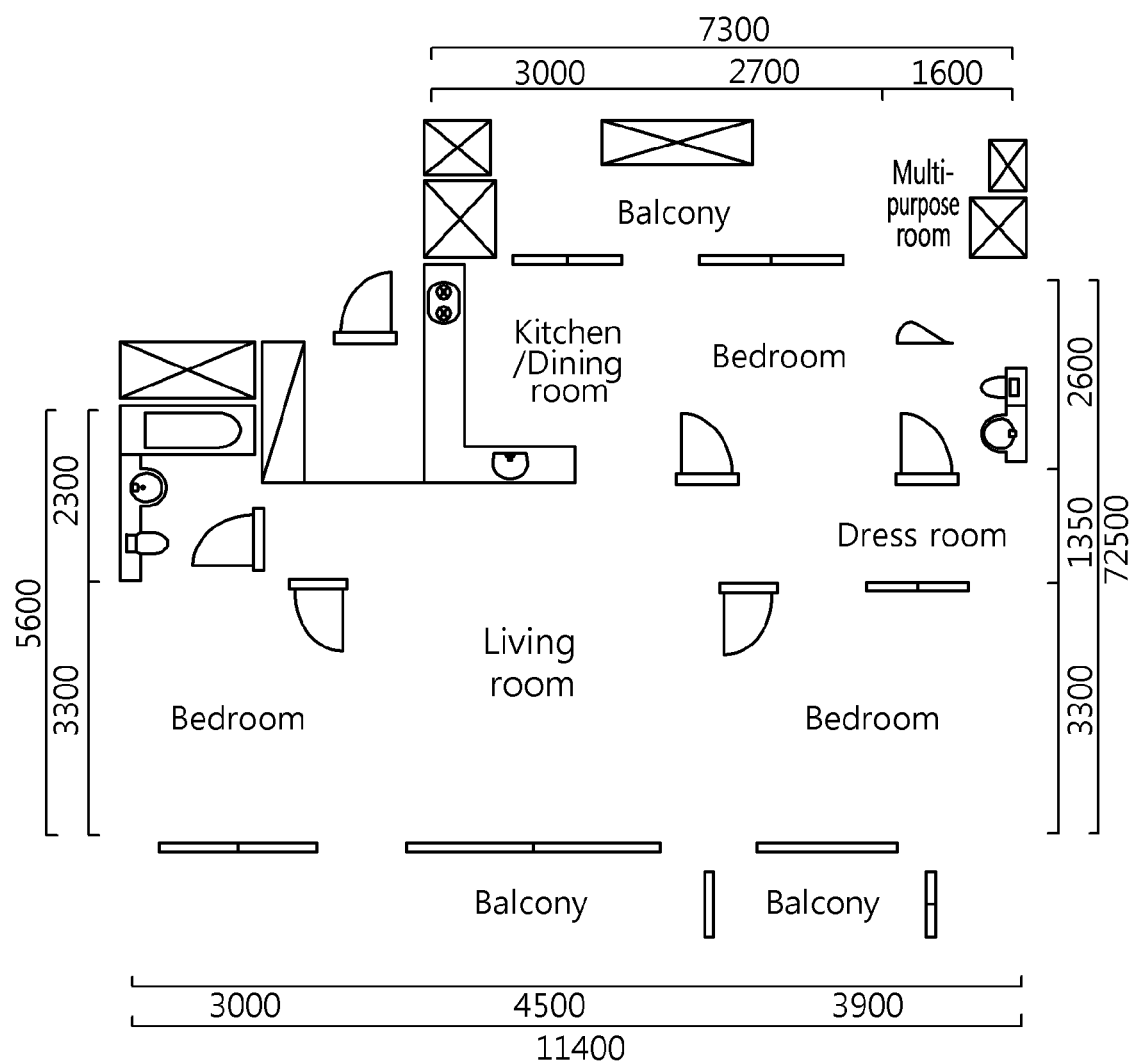

FIG. 7 shows an example of a template-matching state between a noise-removed image and an element-detected image.

For example, the noise-removed image and the element-detected image can be superimposed.

Here, the template matching may be template matching having a door, a window, a washbasin as priority.

Next, after template matching in step S110, outer edge coordinate information and the element coordinate information previously stored may be applied to a CAD program to generate a 2D drawing for the input file.

For example, the position value of the matched element in the template matching is stored (image 7), the image finished with outer edge detection (image 6) and the position value of the stored element (image 7) is calculated to extract element coordinate information, and the outer edge coordinate information and element coordinate information are applied to a CAD program so that an image file may be 2D drafted.

Then, in step S111, a 3D drawing is calculated based on the generated 2D drawing. Here, a method of calculating a 2D drawing into a 3D drawing can be performed using Rhino, 3D MAX, AutoCAD, ArchiCAD program, or the like.

According to an embodiment of the present invention as described above, an image file such as a JPG file, a GIF file, or a PNG file, or a document file such as a PDF file, can be drafted, making it possible to reuse an image file, and it can be more convenient to use by drafting by an automatic program without manual operation of the user.

Meanwhile, the 3D drawing converted by the file conversion method according to an embodiment of the present invention as described above can be used to implement an augmented reality.

For example, a specific object may be implemented as an augmented reality on a 3D drawing converted from an image file or a document file, thereby facilitating the placement of objects and the like.

According to another embodiment of the present invention, it is possible to implement object information as an augmented reality on a 3D drawing generated based on actual measurement information, thereby enabling the implementation of a more realistic augmented reality, and also designate an object generation position of augmented reality so that it is possible to easily place the object without the actual measured 3D drawing information.

Hereinafter, an augmented reality-based object generating apparatus and method according to another embodiment of the present invention will be described in detail with reference to FIG. 8 through FIG. 11.

Figure 8:
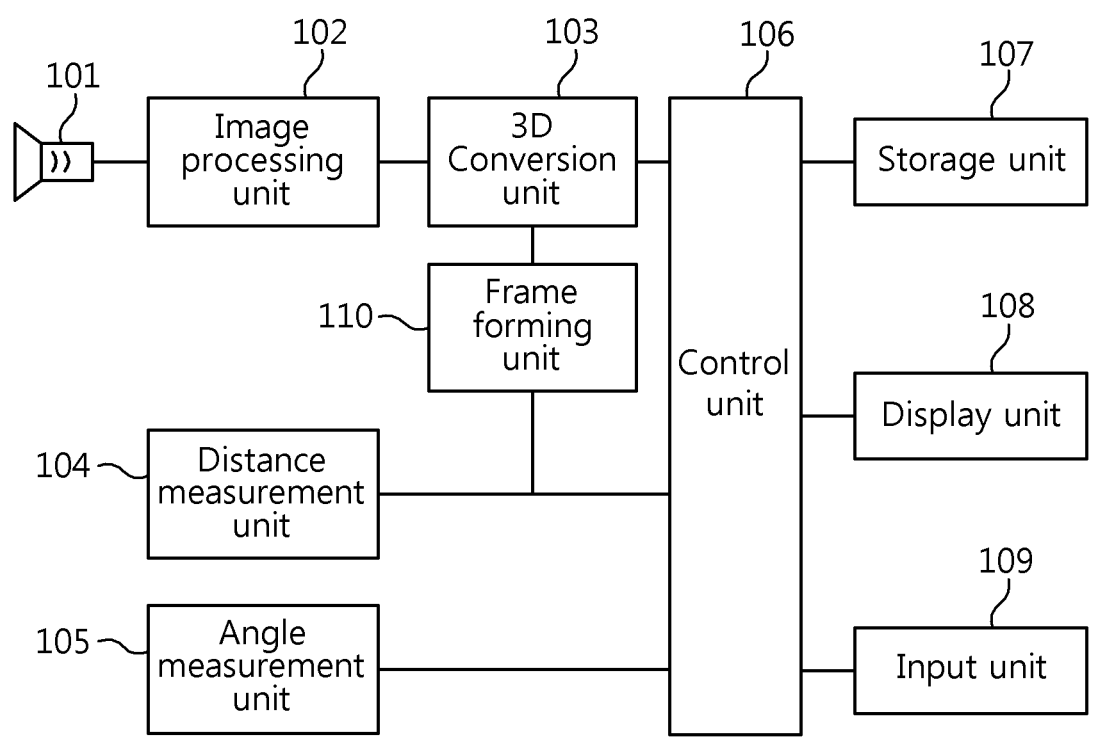
FIG. 8 is a block diagram illustrating a configuration of an augmented reality-based object generation apparatus according to another embodiment of the present invention.

FIG. 8 is a block diagram illustrating a configuration of an augmented reality-based object generating apparatus through actual measurement according to another embodiment of the present invention, wherein the augmented reality-based object generating apparatus includes a camera 101, an image processing unit 102, a 3D conversion unit 103, a distance measurement unit 104, an angle measurement unit 105, a control unit 106, a storage unit 107, a display unit 108, an input unit 109, and a frame forming unit 110.

Referring to FIG. 8, the camera 101 plays a role of acquiring an image of an actual indoor space, a shipbuilding, a plant, an automobile, a media, a game, etc. for generating an object to implement an augmented reality, and the image processing unit 102 plays the role of processing the image obtained by the camera 101 using an ordinary image processing technique.

Here, the subject for implementing augmented reality may be various such as an indoor space, a shipbuilding, a plant, an automobile, a media, a game and the like, and the methods for implementing the augmented reality are all the same, so hereinafter for convenience purposes, details on only the indoor space will be described.

On the other hand, the camera 101 can use a plurality of cameras or a panoramic camera to enable the acquirement of 3D images.

The distance measuring unit 104 measures the distance to the subject to be measured, wherein an infrared sensor, an ultrasonic sensor, or the like can be used. To measure the distance, infrared or ultrasonic waves are emitted to the measurement object and the reflected signal is processed to measure the distance.

The frame forming unit 110 forms a surface by connecting a plurality of position information using the distance measured by the distance measuring unit 104 as position information, and based on the formed surface information, forms an indoor frame corresponding to the actual indoor space.

The 3D conversion unit 103 may be used to draft the actual indoor image processed by the image processing unit 102 or the indoor frame image formed from the frame forming unit 110 using a drawing program.

Meanwhile, the 3D conversion unit 103 may process an image file or a document file using the file conversion method according to an embodiment of the present invention as described with reference to FIGS. 1 to 7, and convert the image file or the document file into a 3D drawing.

The angle measuring unit 105 measures an angle of the camera 101, for example, a photographing angle of the smartphone, when photographing the object to be measured. The angle measuring unit 105 may be implemented using a geomagnetic sensor, a gyro sensor, acceleration sensor or the like mounted on an ordinary smartphone.

The storage unit 107 performs the role of storing the 3D drawing generated by measuring an indoor space and stores distance and angle information of the indoor position. According to the control of the control unit 106, the display unit 108 plays the role of superimposing the specific object at a corresponding position of the indoor drawing displayed on camera view to display the object as an augmented reality.

In addition, the input unit 109 may receive operation information to be operated by a user, and may transmit the received operation inform control unit 106.

The control unit 106 maps the drawing converted by the 3D conversion unit 103, the distance value measured by the distance measuring unit 104 and the angle value measured by the angle measuring unit 105, and stores it in the storage unit 107, and when the user selects a specific object, the selected specific object may be implemented as augmented reality on a 3D drawing designed based on the actual measurement.

Figure 9:
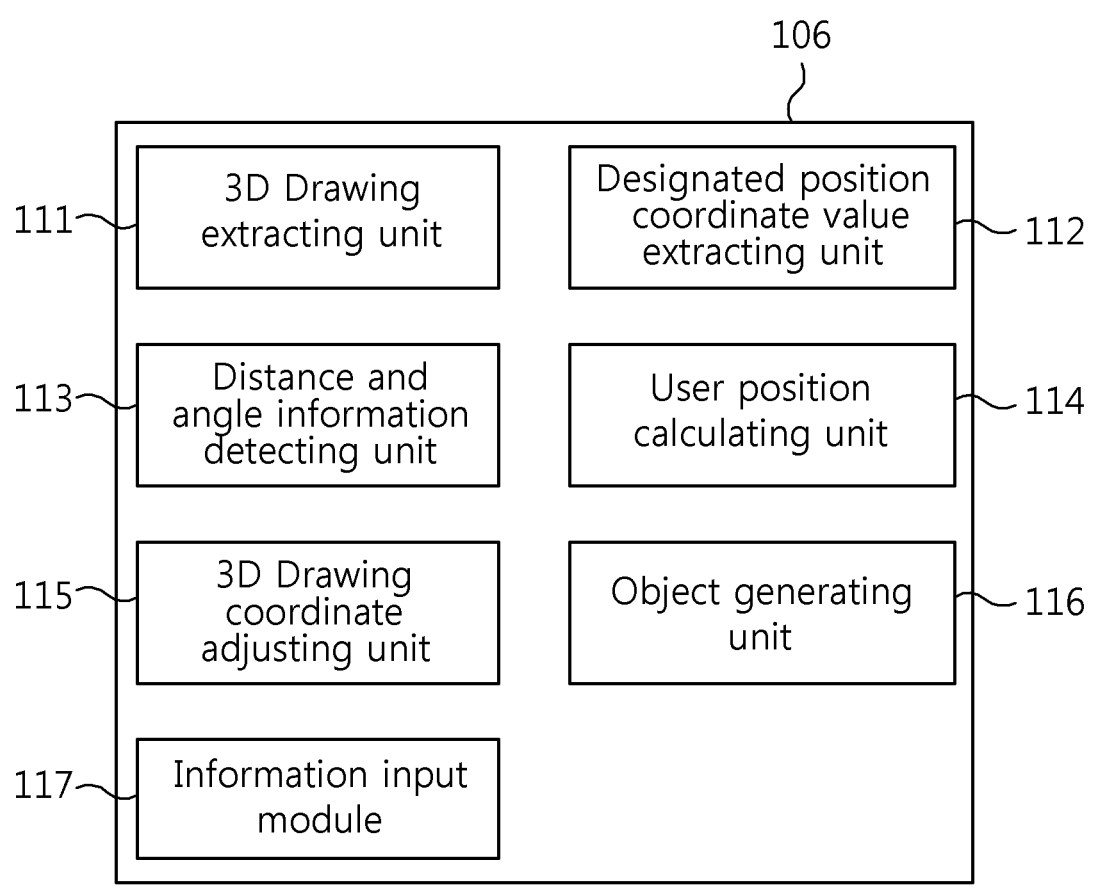
FIG. 9 is a block diagram showing an embodiment of the configuration of a control unit shown in FIG. 8.

As shown in FIG. 9, the control unit 106 includes a 3D drawing extracting unit 111 for extracting a 3D drawing stored in a storage unit, a designated position coordinate value extracting unit 112 for extracting a coordinate value of a position designated by the user on the 3D drawing, a distance and angle information detecting unit 113 for detecting a distance and an angle of an actual position corresponding to the designated position, a user position calculating unit 114 for detecting a position of the user, an object generating unit 116 for generating an object at a corresponding position of the camera based on the detected user position, a 3D drawing coordinate adjusting unit 115 for re-adjusting the coordinates of the 3D drawing corresponding to the user position calculated by the user position calculating unit 114 to be responsive to the movement of a camera view, and an information input module 117 for receiving operation information of the user.

The user position calculating unit 114 processes the coordinate value of the 3D drawing designated by the user and the coordinate value of the actual position corresponding to the 3D drawing designated by the user with a trigonometric function to compute the current user position on the basis of the origin coordinate at the time the 3D drawing was made.

The configuration and operation of the augmented reality-based object generating apparatus through actual measurement will be described in detail below.

First, in order to generate an object based on an augmented reality, an actual indoor space for implementing an augmented reality is photographed through a camera 101 to obtain an indoor image, or an indoor frame image corresponding to an actual indoor space is acquired through a frame forming unit 110.

For example, when the camera 101 is used, a plurality of cameras may be used or a panoramic camera may be used.

The frame forming unit 110 obtains a plurality of distance values (position coordinates) with respect to the measurement object (indoor wall surface) measured in conjunction with the distance measuring unit 104, and the plurality of position coordinates are connected with a line to form a surface. Then, each of the surfaces is combined into a frame to form an indoor frame that is identical to the actual indoor space. Here, the frame refers to a wall surface structure in which a wall structure of an actual indoor space is formed through position coordinates.

The image processing unit 102 can process the indoor image acquired by the camera 101 using an ordinary image processing technique.

Meanwhile, the 3D conversion unit 103 performs drafting of the actual indoor image processed by the image processing unit 102 or the frame formed by the frame forming unit 110 into 3D using a drawing program (for example, a CAD program). Here, the photographed indoor image may be drafted into 2D to be used.

The distance measuring unit 104 measures a distance of a measurement object (a specific position indoors) by using a distance measuring method using an infrared sensor, an ultrasonic sensor or a laser pointer.

Further, the angle measuring unit 105 may measure the angle of the camera 101, for example, photographing angle of a smartphone, when capturing the image of the measurement object using a geomagnetic sensor, a gyro sensor, an acceleration sensor, and the like that is mounted on an ordinary smartphone.

The control unit 106 maps the distance measurement information and the angle measurement information to the 3D drawing information generated through the 3D conversion unit 103 and stores the mapping information in the storage unit 107.

Then, when a user selects a specific object through the camera of the smartphone, that is, photographs a specific object (for example, furniture to be placed indoors, shipbuilding, plant, automobile, media, game, etc.), the distance information of the specific object and the camera, photographing angle information of the camera, and the like are calculated and stored.

Next, when the user selects a 3D drawing for the actual indoor space stored in the storage unit 107, the 3D drawing extraction unit 111 extracts the 3D drawing stored in the storage unit 107 and displays it on a screen.

When the user designates a specific position in a state that the 3D drawing of the indoor space is displayed on the screen, the designated position coordinate value extraction unit 112 extracts the coordinate value for the designated position.

Here, since the coordinate values for each position are generated and stored when the indoor photographed image is produced in the 3D drawing, the coordinate value for the designated position can quickly be quickly extracted as soon as the user designates the position.

Then, the distance and the angle of the actual position corresponding to the 3D plane specified by the distance and angle information detecting unit 113 are calculated. For example, when photographing through a camera in an actual indoor space, distance information between the camera and a specific position in the actual indoor space, and the photographing angle of the camera and such are calculated.

Figure 10:
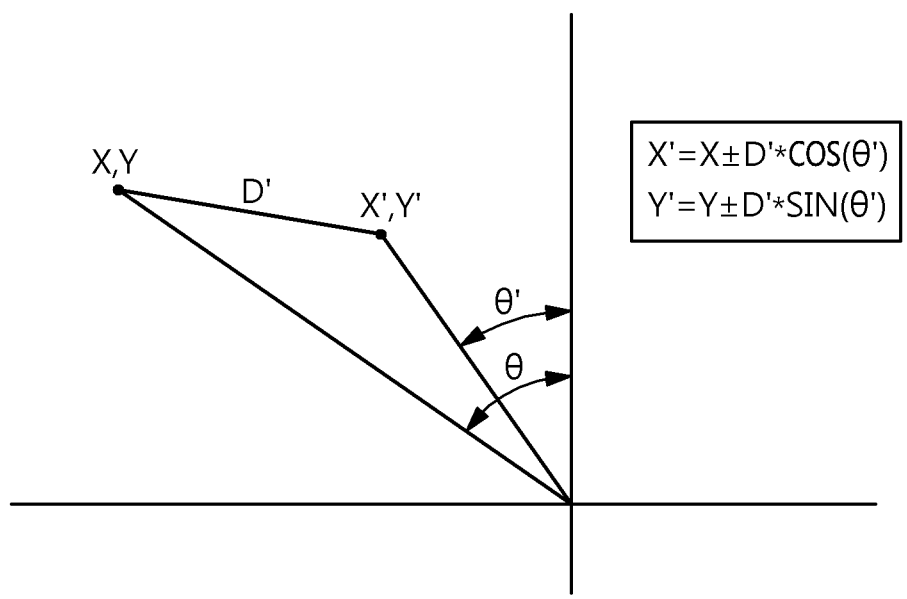
FIG. 10 is a diagram for explaining an embodiment of a method of detecting a user position.

Next, the user position calculation unit 114 detects the position of the user based on the calculated information. For example, the user position calculation unit 114 processes the coordinate values of the 3D drawing designated by the user and the coordinate values of the actual positions corresponding to the 3D drawing designated by the user using the trigonometric function as shown in FIG. 10, to allow the calculation of the current user position based on the origin coordinate at the time the 3D drawing was produced.

Thereafter, the 3D drawing coordinate adjusting unit 115 adjusts the coordinates of the 3D drawing corresponding to the user position calculated by the user position calculating unit 114 to react to the movement of the camera view.

For example, motion vectors are obtained in response to a user's angle and motion using a geomagnetism sensor, a gyro sensor, an acceleration sensor and such of a smartphone, and the coordinate values of the 3D drawing are readjusted based on the motion vector thus calculated so the coordinates where the object is to be placed may be calculated. That is, the generation position of the object to be generated as the augmented reality is designated.

Next, the object generating unit 116 generates an object at a corresponding position of the camera based on the detected user position, and implements the object as an augmented reality.

Figure 11:
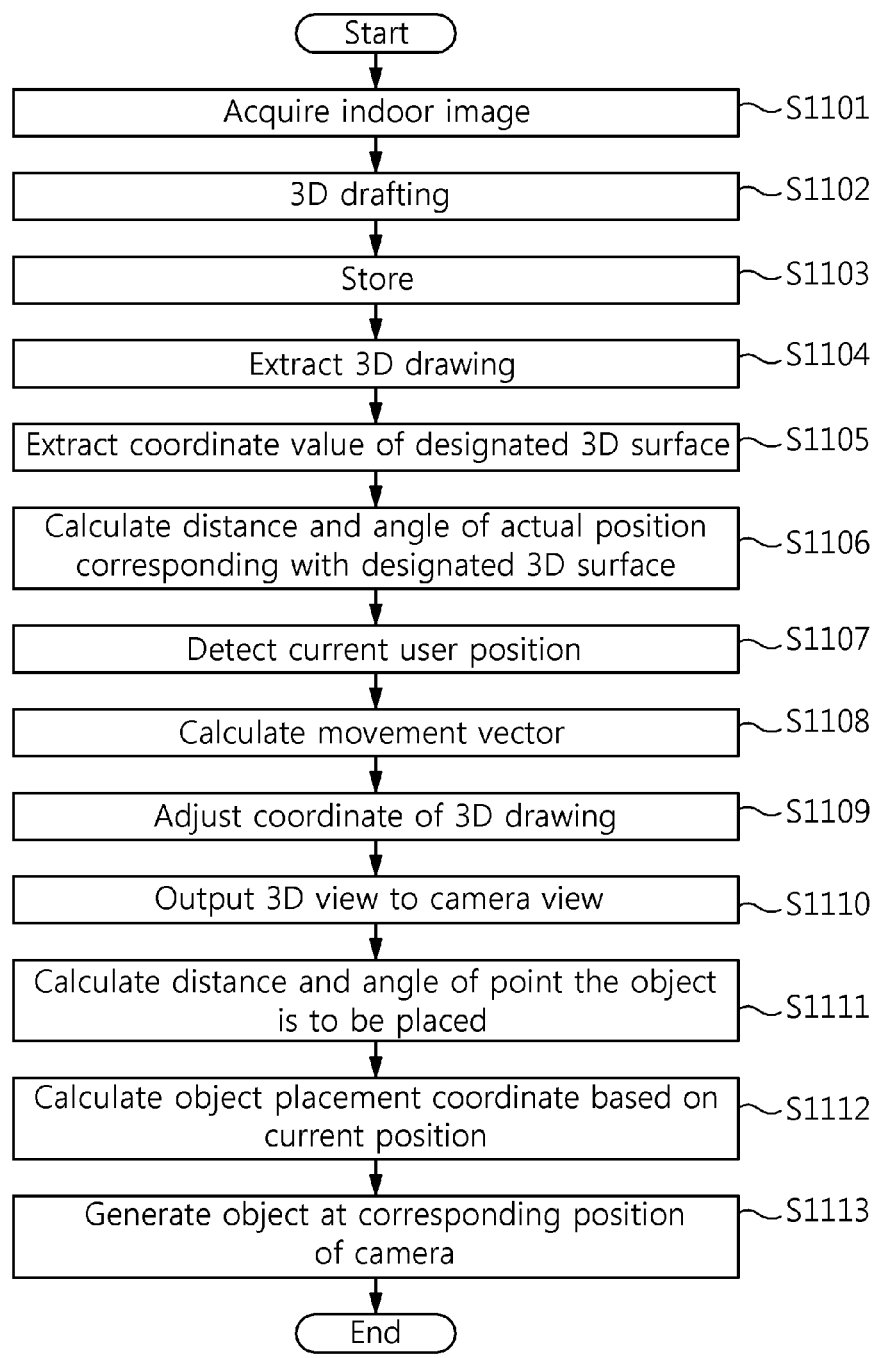
FIG. 11 is a flowchart illustrating a method of generating an augmented reality-based object according to another embodiment of the present invention.

FIG. 11 is a flowchart illustrating a method of generating an augmented reality-based object through actual measurement according to another embodiment of the present invention.

Referring to FIG. 11, an augmented reality-based object generating method includes the steps of: (a) drafting and storing 3D views of an image obtained to implement an augmented reality using a drawing program in steps S1101 to S1103; (b) extracting a coordinate value of a position designated by a user in the stored 3D drawing in steps S1104 to S1105; (c) calculating a distance and an angle of an actual indoor position corresponding to the designated position in step S1106; (d) calculating a position of the current user in step S1107; (e) calculating a motion vector according to the user position calculated in the step (d), and adjusting the coordinates of the 3D drawing using the calculated motion vector to react to movement of the camera view in steps S1108 to S1109; (f) outputting a 3D view to the camera view and generating an object at a corresponding position of the camera to implement an augmented reality in steps S1110 to S1113.

The step (d) of step S1107 processes the coordinate value of the 3D drawing designated by the user and the coordinate value of the actual position corresponding to the 3D drawing designated by the user with a trigonometric function to determine the current user position based on the origin coordinate at the time the 3D drawing was produced.

Meanwhile, step (e) may include the steps of (e1) calculating a distance and angle to a point in the actual indoor space in which the object selected by the user is to be placed in step S1111, (e2) calculating object placement coordinates based on the current position in step S1112, (e3) calculating a corresponding position of the camera based on the object placement coordinates, and generating an object as an augmented reality at the corresponding position of the camera in step S1113.

More specifically, in step S1101, to generate an object based on an augmented reality, an actual indoor space for implementing an augmented reality is photographed through a camera 101 to acquire an indoor image, or an indoor frame image can be formed corresponding to the actual indoor space through a frame forming unit 110.

For example, when the camera 101 is used, a plurality of cameras may be used or a panoramic camera may be used.

The frame forming unit 110 obtains a plurality of distance values (position coordinates) with respect to the measurement object (indoor wall surface) measured in conjunction with the distance measuring unit 104, and the plurality of position coordinates are connected with a line to form a surface. Then, each of the surfaces is combined into a frame to form an indoor frame that is identical to the actual indoor space.

Here, the frame refers to a wall surface structure in which a wall structure of an actual indoor space is formed through position coordinates.

In step S1102, the image processing unit 102 processes the acquired image using an ordinary image processing technique. Then, the 3D conversion unit 103 drafts the actual indoor image processed by the image processing unit 102 in 3D using a drawing program (CAD program). Here, the photographed indoor image may be drafted to be used as 2D.

At this time, the distance measuring unit 104 measures the distance of a measurement object (a specific position in the indoor space) using a distance measuring method using an infrared sensor, an ultrasonic sensor, or a laser pointer, and transmits the measured distance to the controller 106.

Further, the angle measuring unit 105 may measure the angle of the camera 101, for example, photographing angle of a smartphone, when capturing the image of the measurement object using a geomagnetic sensor, a gyro sensor, an acceleration sensor, and the like that is mounted on an ordinary smartphone.

The control unit 103 maps the distance measurement information and the angle measurement information to the 3D drawing information generated through the 3D conversion unit 103 and may store the mapping information in the storage unit 107 in step S1103.

Then, when a user selects a specific object through the camera of the smartphone, that is, photographs a specific object (for example, furniture to be placed indoors), the distance information of the specific object and the camera, photographing angle information of the camera, and the like are calculated and stored.

Next, when the user selects a 3D drawing for the actual indoor space stored in the storage unit 107, the 3D drawing extraction unit 111 extracts the 3D drawing stored in the storage unit 107 and displays it on a screen in step S1104.

In addition, when the user designates a specific position in a state that the 3D drawing of the indoor space is displayed on the screen, the designated position coordinate value extraction unit 112 extracts the coordinate value for the designated position in step S1105.

Here, since the coordinate values for each position are generated and stored when the indoor photographed image is produced in the 3D drawing, the coordinate value extraction can quickly extract the coordinate values for designated position as soon as the user designates the position.

Then, in step S1106 the distance and the angle of the actual position corresponding to the 3D plane specified by the distance and angle information detecting unit 113 are calculated. For example, when photographing through a camera in an actual indoor space, distance information between the camera and a specific position in the actual indoor space, and the photographing angle of the camera and such are calculated.

Next, in step S1107 the user position calculation unit 114 detects the position of the user based on the calculated information. For example, the user position calculation unit 114 processes the coordinate values of the 3D drawing designated by the user and the coordinate values of the actual positions corresponding to the 3D drawing designated by the user using the trigonometric function as shown in FIG. 10, to allow the calculation of the current user position based on the origin coordinate at the time the 3D drawing was produced.

Thereafter, in step S1108 and step S1109 the 3D drawing coordinate adjusting unit 115 adjusts the coordinates of the 3D drawing corresponding to the user position calculated by the user position calculating unit 114 to react to the movement of the camera view. For example, motion vectors are obtained in response to a user's angle and motion using a geomagnetic sensor, a gyro sensor, and an acceleration sensor of a smartphone, and the coordinate values of the 3D drawing are readjusted based on the motion vector thus calculated, to calculate the coordinates to place the object.

That is, the generation position of the object to be generated as the augmented reality is designated.

Next, in steps S1110 to S1113 the object generating unit 116 generates an object at a corresponding position of the camera based on the detected user position, and implements the object as an augmented reality.

For example, the 3D view is output to the camera view in step S1110 and the distance and angle to the point where the object (e.g., furniture) is to be placed is calculated in step S1111. Thereafter, in step S1112, the object placement coordinates are calculated based on the current position. In step S1113, an object (e.g., furniture) is generated at a corresponding position of the camera, and the object is displayed through the augmented reality.

The above-described methods according to the present invention can be stored in a computer-readable recording medium made of a program for execution on a computer. Examples of the computer-readable recording medium include a ROM, a RAM, a CD-ROM, a floppy disk, an optical data storage device, and the like, and may also be implemented in the form of a carrier wave (for example, transmission over the Internet).

The computer readable recording medium may be distributed over networked computer systems so that computer readable code in a distributed manner can be stored and executed. In addition, functional programs, codes and code segments for implementing the above method can be easily inferred by programmers of the technical field to which the present invention belongs.

Meanwhile, the program for executing the methods according to the present invention may be installed in a terminal device according to an embodiment of the present invention, and may be a file conversion method according to an embodiment of the present invention, or an augmented reality-based object generation method that can be performed in a terminal device in which the program is installed.

Further, while the present invention has been particularly shown and described with reference to exemplary embodiments thereof, it is to be understood that the invention is not limited to the disclosed exemplary embodiments, but, on the contrary, it will be understood by those skilled in the art that various changes in form and details may be made therein without departing from the spirit and scope of the present invention.

INDUSTRIAL APPLICABILITY

The present invention is applied to a technique of drafting a file, for example, in various industrial fields such as a construction of a 3D indoor space, a plant, a 3D indoor space information business, a spatial information business, and a 3D indoor map construction business and the like.

Further, the present invention can be applied to a technique for generating objects such as furniture, shipbuilding, plants, media, automobiles, games and the like through the augmented reality technology.

What is claimed is:
1. A method for converting an image file or document file into a drawing file comprising,
    extracting an outline from an image of a subject file to be drafted;
    detecting corner feature points from the image of the subject file to be drafted based on the extracted outline to coordinate the corner feature points into outer edge coordinate information and connecting the detected corner feature points with a line to generate a first image;

removing noise from the first image and detecting one or more elements to coordinate the elements into element coordinate information and generating a second image including the one or more detected elements;

superimposing the noise-removed first image and the second image including the one or more detected elements; and generating a drawing file for the subject file to be drafted by using the outer edge coordinate information and element coordinate information.

2. A method of claim 1, wherein the subject file to be drafted comprises one of a JPG file, a GIF file, a PNG file, and a PDF file.

3. A method of claim 1, wherein the outline extracting step comprises the steps of, converting the image of the subject file to be drafted into gray scale;

truncate coding the image converted into gray scale to obtain the most significant bit information; and extracting the outline by applying a median filter to the most significant bit information for smoothing out.

4. The method of claim 3, wherein the most significant bit information obtaining step uses bit-plane slicing.

5. The method of claim 1, wherein the first image generating step comprises, detecting a corner image from the outline-extracted image by using Harris corner detection; and detecting the corner feature points using the detected corner image.

6. The method of claim 1, wherein the second image generating step comprises, detecting an outline by obtaining information on a linear component significant in the noise-removed first image; and detecting an element comprising at least one of a door, a window and a washbasin from which the detected outline is removed.

7. The method of claim 1, wherein the superimposing step template-matches the first and second images with priority on at least one of a door, a window, and a washbasin.

8. The method of claim 1, wherein the element coordinate information detects a position value of the detected element, and is obtained by calculating a position value of the outline-removed image and detected element.

9. The method of claim 1, wherein the drawing file generation step comprises generating a 2D drawing by applying the outer edge coordinate information and the element coordinate information to a CAD program.

10. The method of claim 1, further comprising the step of generating a 3D drawing file based on the generated drawing file.

11. A terminal device comprising: at least one processor, and a memory in which a program for executing the method of claim 1 is installed.

12. An apparatus for converting an image file or document file into a drawing file comprising, an input unit for receiving a subject file to be drafted;

an image processing unit for extracting an outline from an image of the subject file to be drafted, detecting corner feature points from the image of the subject file to be drafted based on the extracted outline to coordinate the corner feature points into outer edge coordinate information and connecting the detected corner feature points with a line to generate a first image, removing noise from the first image and detecting one or more elements to coordinate the elements into element coordinate information and generating a second image including the one or more detected elements, superimposing the noise-removed first image and the second image including the one or more detected elements, and then generating a drawing file for the subject file to be drafted by using the outer edge coordinate information and element coordinate information; and a storage unit for storing the generated drawing file.

* * * * *